US012796374B2

(12) United States Patent
Kanazawa

(10) Patent No.: US 12,796,374 B2
(45) Date of Patent: Nov. 10, 2026

(54) PROCESSING DEVICE AND METHOD

(71) Applicant: TOKYO SEIMITSU CO., LTD., Tokyo (JP)

(72) Inventor: Masaki Kanazawa, Tokyo (JP)

(73) Assignee: TOKYO SEIMITSU CO., LTD

( * ) Notice: Subject to any disclaimer, the term of this patent is extended or adjusted under 35 U.S.C. 154(b) by 626 days.

(21) Appl. No.: 17/921,732

(22) PCT Filed: Apr. 14, 2021

(86) PCT No.: PCT/JP2021/015397
§ 371 (c)(1),
(2) Date: Oct. 27, 2022

(87) PCT Pub. No.: WO2021/250996
PCT Pub. Date: Dec. 16, 2021

(65) Prior Publication Data
US 2023/0238257 A1 Jul. 27, 2023

(30) Foreign Application Priority Data
Jun. 9, 2020 (JP) ................................ 2020-100519

(51) Int. Cl.
*H10P 72/00* (2026.01)
*H10P 52/00* (2026.01)
*H10P 72/76* (2026.01)

(52) U.S. Cl.
CPC .......... *H10P 72/0428* (2026.01); *H10P 52/00* (2026.01); *H10P 72/0616* (2026.01);
(Continued)

(58) Field of Classification Search
CPC ............. H01L 21/67092; H01L 21/304; H01L 21/67288; H01L 21/68785; H01L 21/683;
(Continued)

(56) References Cited

U.S. PATENT DOCUMENTS 7,037,758 B2 * 5/2006 Karasawa ........... H01L 21/3043
438/106
7,438,631 B2 * 10/2008 Nagamoto ................ C09J 7/20
451/526
(Continued)

FOREIGN PATENT DOCUMENTS

JP 2003273052 9/2003
JP 2009182099 8/2009
(Continued)

OTHER PUBLICATIONS

International Search Report, PCT/JP2021/015397, dated Jun. 29, 2021, 2 pages.
(Continued)

*Primary Examiner* — Eduardo A Rodela
(74) *Attorney, Agent, or Firm* — Fattibene and Fattibene, LLC; Paul A. Fattibene

(57) ABSTRACT

A processing device and method for safely processing a wafer having bumps formed on a surface thereof. A processing device is provided with: a chuck capable of holding a bump region of a wafer; a support ring having a support surface for supporting a bend region which extends from the bump region to an outer peripheral region and in which a film is bent, the support ring capable of supporting the outer peripheral region of the wafer; and a chuck table in which the chuck is housed substantially centrally and the support ring is housed around the chuck.

11 Claims, 7 Drawing Sheets

(52) U.S. Cl.
CPC ...... *H10P 72/7611* (2026.01); *H10P 72/7614* (2026.01); *H10P 72/7624* (2026.01)

(58) Field of Classification Search
CPC ......... H01L 21/67051; H01L 21/67253; H01L 21/68757; H01L 21/687; H01L 21/68714; H01L 21/68721; H01L 21/68735; H01L 21/6875; B24B 49/02; H10P 72/70; H10P 72/72; H10P 72/74; H10P 72/7422; H10P 72/7611; H10P 72/7614; H10P 72/7624; H10P 72/0428; H10P 52/00; H10P 72/0616; H10P 72/0414; H10P 72/0604; H10P 72/7616
See application file for complete search history.

(56) References Cited

U.S. PATENT DOCUMENTS

| | | | | |
|---|---|---|---|---|
| 8,052,505 | B2 * | 11/2011 | Kanazawa | B24B 37/042 451/388 |
| 10,727,128 | B2 * | 7/2020 | Priewasser | H01L 21/304 |
| 12,064,946 | B2 * | 8/2024 | Nogami | H01L 21/67092 |
| 12,103,288 | B2 * | 10/2024 | Nogami | B32B 37/12 |
| 2009/0191796 | A1 | 7/2009 | Kanazawa et al. | 451/54 |
| 2013/0230966 | A1 | 9/2013 | Martin et al. | 438/458 |
| 2017/0282326 | A1 | 10/2017 | Ramos et al. | B24B 37/042 |
| 2019/0378732 | A1 * | 12/2019 | Hanajima | H01L 21/67253 |
| 2021/0287883 | A1 * | 9/2021 | Tamamushi | H01L 21/68735 |
| 2021/0370460 | A1 * | 12/2021 | Sakai | H01L 22/26 |
| 2021/0391152 | A1 * | 12/2021 | Koiwa | H01L 21/68735 |
| 2022/0344207 | A1 * | 10/2022 | Takita | H01L 21/67092 |

FOREIGN PATENT DOCUMENTS

| | | |
|---|---|---|
| JP | 2009206475 | 9/2009 |
| JP | 2018122421 | 8/2018 |
| JP | 2019212803 | 12/2019 |
| JP | 2020025008 | 2/2020 |
| JP | 2020025010 | 2/2020 |
| KR | 20090083845 | 8/2009 |
| KR | 20130100710 | 9/2013 |

OTHER PUBLICATIONS

Korean action in counterpart application No. 10-2022-7040519, dispatched May 13, 2024, with English translation, 11 pages.
First Office Action in counterpart Chinese application No. 202180041114.9, Issuing Date May 9, 2025; with English translation; 11 pages.
International Preliminary Report on Patentability, PCT/JP2021/015397, dated May 26, 2022, 3 pages.

* cited by examiner

PROCESSING DEVICE AND METHOD

TECHNICAL FIELD

The present invention relates to a processing device and method for processing a wafer, having a plurality of bumps formed on the front surface, thin.

BACKGROUND ART

In the fields of semiconductor manufacturing, a processing device that pushes a grinding surface of a rotating grinding stone against a semiconductor wafer (hereinafter referred to as "wafer") such as a silicon wafer to grind the back surface of the wafer is known as a device for grinding the wafer thin and flat. When grinding the back surface of the wafer, a film for protecting the front surface is attached to the front surface of the wafer to protect the chips and bumps formed on the front surface of the wafer.

When the grinding of the back surface of the wafer is terminated, a dicing film is attached to the back surface of the wafer in a dicing film attachment device, and the wafer and a mount frame are integrated. Next, after a front surface protection film attached to the front surface of the wafer is stripped, the wafer is diced to small cubes. The chips formed by the dicing are picked up and mounted on the lead frame (see e.g., patent document 1).

FIG. 8 is an example of a processing device that performs back surface grinding of a wafer. A wafer 90 has a bump 93 formed on a chip 92 of a front surface 91 and is attached with a film 94 so as to cover the bump 93. The wafer 90 is adsorbed to and held by a table 96 such that a back surface 95 faces upward, and a grinding stone 98 grinds the back surface 95 while a tubular body 97 is supporting the outer periphery of the wafer 90.

PRIOR ART REFERENCES

Patent Documents

Patent Document 1: Japanese Laid-Open Patent Publication No. 2009-206475

DISCLOSURE OF THE INVENTION

Problems to be Solved by the Invention

However, in the processing device as shown in FIG. 8, a step difference between the table 96 and the tubular body 97 increases according to the height of the bump 93, and in the wafer 90 with a high bump in which the height of the bump 93 exceeds 100 μm, the film 94 cannot absorb the step difference, and the film 94 floats with a gap from the table 96 thus forming an annular gap when viewed in plan view, whereby the thin wafer 90 may crack from a portion that is not supported due to the gap at the time of back surface grinding.

A technical problem to be solved to safely process a wafer having bumps formed on the front surface arises, and it is an object of the present invention to solve such a problem.

Means for Solving the Problems

In order to achieve the above object, a processing device according to the present invention relates to a processing device that grinds a back surface of a wafer, that includes a bump region in which bumps are formed on a front surface, and an outer peripheral region around the bump region, and in which a film is attached to the front surface; the processing device including a chuck capable of holding the bump region of the wafer; a support member having a support surface that supports a curved region in which the film curves from the bump region toward the outer peripheral region and is capable of supporting the outer peripheral region of the wafer; and a chuck table that accommodates the chuck and accommodates the support member at an outer periphery of the chuck According to such a configuration, the support member supports the curved region of the film that curves so as to float from the chuck by the height of the bump, so that the film is supported without gap by the support member and the chuck, and the wafer with a bump can be safely processed without breaking.

Furthermore, in the processing device according to the present invention, the support member is preferably fitted into an annular groove formed at the outer periphery of the chuck.

According to such a configuration, the support member is annularly provided to surround the chuck, thus supporting the wafer over a wide range, whereby the wafer with a bump can be safely processed without breaking.

In addition, in the processing device according to the present invention, the support member and the chuck table are preferably made from a material exhibiting substantially the same thermal expansion coefficient.

According to such a configuration, since the support member and the chuck table thermally expand in a substantially uniform manner by friction heat generated at the time of processing of the wafer, the wafer can be processed with high accuracy.

Furthermore, in the processing device according to the present invention, the chuck table is preferably provided with a drain hole that communicates the annular groove and an opening formed in a peripheral surface of the chuck table.

According to such a configuration, grinding water and the like in the annular groove can be drained to the outside.

In addition, the processing device according to the present invention further preferably includes a washing means that injects 2 fluids toward the front surface of the chuck table.

According to such a configuration, in a washing device that pushes a hard washing stone, and the like against the chuck table, the support member is projected out from the chuck and thus the front surface of the chuck cannot be washed, whereas the entire surface of the chuck table including the support member and the chuck can be efficiently washed using the 2 fluids.

Furthermore, in order to achieve the above object, a processing method according to the present invention relates to a processing method for grinding a back surface of a wafer including a bump region in which bumps are formed on a front surface and an outer peripheral region around the bump region, and in which a film is attached to the front surface, the processing method including the steps of measuring a shape of a curved region in which the film curves from the bump region toward the outer peripheral region of the film; forming a support surface corresponding to the shape of the curved region on an inner peripheral edge of an upper end face of the support member; grinding a front surface of a chuck capable of holding the bump region of the wafer and a front surface of a chuck table accommodating the chuck to be substantially flat; fitting the support member into an annular groove of the chuck table formed on an outer periphery of the chuck with a lower end face of the support member facing upward; grinding the lower end face of the support member from the front surface of the chuck table to a predetermined height; inverting the support member upside down; and holding the wafer by the chuck with the support surface supporting the curved region and the upper end face supporting the outer peripheral region.

According to such a configuration, the support member supports the curved region of the film that curves so as to float from the chuck by the height of the bump, so that the film is supported without gap by the support member and the chuck, and the wafer with a bump can be safely processed without breaking.

In addition, according to the processing method of the present invention, in the step of grinding the lower end face of the support member, the lower end face is preferably ground while measuring a height of the lower end face of the support member with respect to a front surface of the chuck table.

According to such a configuration, the support member can be processed with high accuracy by measuring the height of the lower end face with respect to the front surface of the chuck table in real time during the grinding process.

Effect of the Invention

In the present invention, the film is supported without gap by the support member and the chuck, and thus the wafer with a bump can be safely processed without breaking.

BEST MODE FOR CARRYING OUT THE INVENTION

One embodiment of the present invention will be described with reference to the drawings. Hereinafter, when referring to numbers, numerical values, amounts, ranges and the like of the components, other than when particularly indicated clearly and when clearly limited to a specific number in principle, it is not limited to such specific number, and a number greater than or equal to and less than or equal to the specific number may be adopted.

In addition, when referring to the shape and position relationship of the components and the like, other than when particularly indicated clearly and when clearly considered otherwise in principle, it includes shapes and the like substantially approximate or similar to such shapes and the like.

Furthermore, the drawings may be exaggerated, for example, characteristic portions may be enlarged to facilitate the understanding of the characteristics, and the dimensional ratio and the like of the components may not necessarily be the same as the actual dimensional ratio. Moreover, in the cross-sectional view, hatching of some components may be omitted to facilitate the understanding of the cross-sectional structure of the component.

Figure 1:
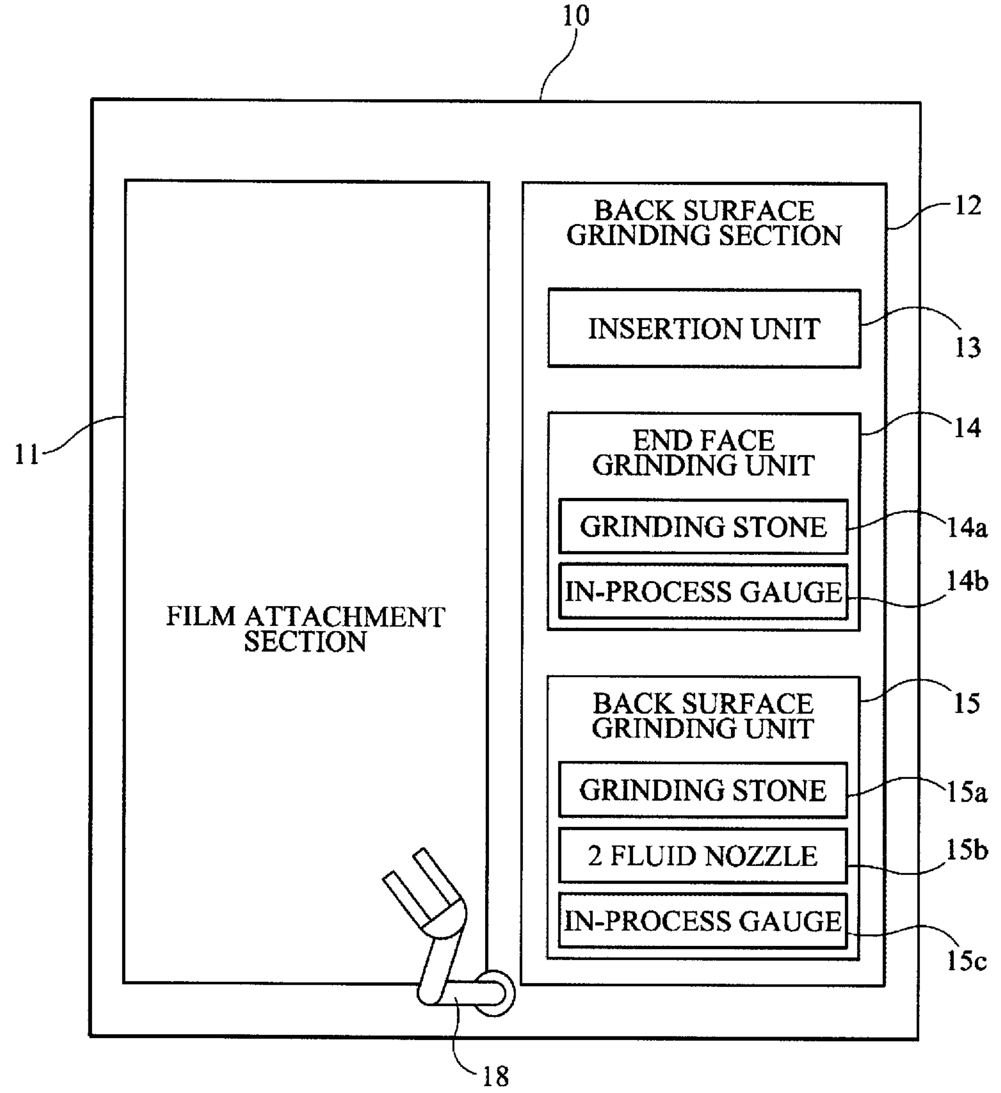
FIG. 1 is a schematic view showing an outline of a processing device according to one embodiment of the present invention.
Figure 2A:
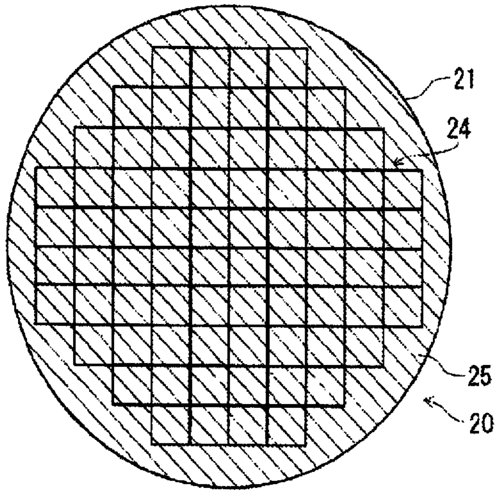
FIG. 2(*a*) is a plan view of a wafer, FIG. 2(*b*) is a longitudinal cross-sectional view of the wafer, and FIG. 2(*c*) is an enlarged view of the main part of the wafer.
Figure 2B:
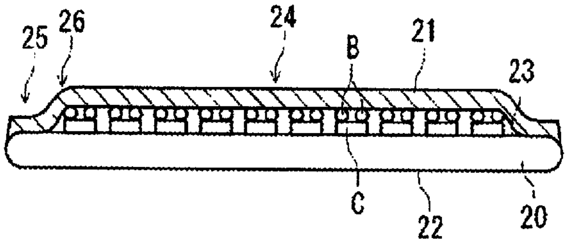
Figure 2C:
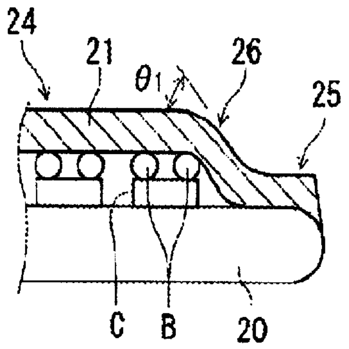

A wafer 20 made of silicon having a plurality of chips C including bumps B formed on a front surface 23 shown in FIGS. 2(*a*) and 2(*b*) is supplied to a processing device 10 shown in FIG. 1. The processing device 10 includes a film attachment section 11 that attaches a BG film 21 to the wafer 20, and a back surface grinding section 12 that grinds a back surface 22 of the wafer 20.

The back surface grinding section 12 includes an insertion unit 13, an end face grinding unit 14, and a back surface grinding unit 15.

The insertion unit 13 inserts a support ring 30 into an annular groove 17 formed in advance in the chuck table 16. Note that an operator may insert the support ring 30 into the annular groove 17 instead of using the insertion unit 13.

The end face grinding unit 14 grinds an end face of the support ring 30 attached to the chuck table 16 with a grinding stone 14*a*. The end face grinding unit 14 includes an in-process gauge 14*b*, to be described later.

The back surface grinding unit 15 grinds the back surface 22 of the wafer 20 with a grinding stone 15*a*. The back surface grinding unit 15 includes a 2 fluid nozzle 15*b* having a known configuration that injects 2 fluids in which mixed is fined with high-speed gas toward the chuck table 16. Furthermore, the back surface grinding unit 15 includes an in-process gauge 15*c* that performs thickness measurement of the wafer 20 during the back surface grinding of the wafer 20. The back surface grinding unit 15 may be configured to also act as the end face grinding unit 14. Reference numeral 18 indicates a robot hand that transports the wafer 20, to which the BG film 21 is attached in the film attachment section 11, to the back surface grinding unit 15.

As shown in FIGS. 2(*a*) and 2(*b*), the wafer 20 has the plurality of chips C formed only in a central region 24 of the front surface 23 of the wafer 20, and each chip C is formed with the bump B serving as an electrical contact. In other words, the chip C and the bump B are not formed in an outer peripheral region 25 of the wafer 20. Hereinafter, the central region 24 is referred to as a bump region 24.

The BG film 21 is attached to the front surface 23 side of the wafer 20 so as to cover the entire surface. The BG film 21 protects the chip C and the bump B at the time of back surface grinding, described later, and suppresses grinding water from flowing to between the wafer 20 and the BG film 21 and contaminating the chip C and the bump B.

As shown in FIGS. 2(*b*) and 2(*c*), the BG film 21 smoothly curves according to the height of the bump B between the bump region 24 and the outer peripheral region 25. Hereinafter, a region where the BG film 21 curves is referred to as a curved region 26. A tapered angle Θ1 in the curved region 26 of the BG film 21 is set according to the height of the bump B, the hardness of the BG film 21, the width of the outer peripheral region 25, and the like within a range of about one to ten degrees.

Figure 3A:
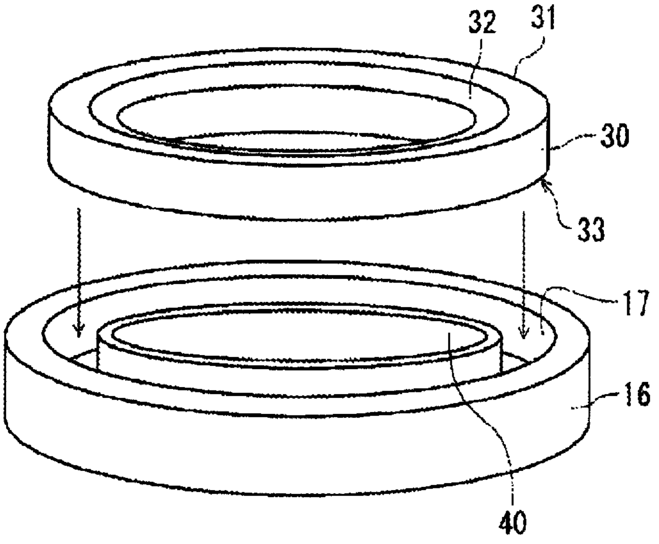
FIG. 3(*a*) is an assembly diagram of a chuck table and a support member, and FIG. 3(*b*) is a perspective view showing the chuck table in a state where the support member is fitted therein.
Figure 3B:
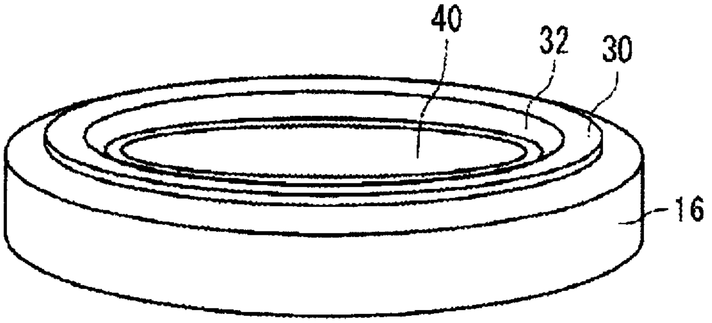

As shown in FIGS. 3(*a*) and 3(*b*), the chuck 40 made of porous material such as alumina is embedded substantially centrally in the front surface of the chuck table 16. The chuck table 16 includes a pipeline (not shown) extending through the inside to the front surface. The pipeline is connected to vacuum source, a compressed air source, or water supply source (not shown). When the vacuum source is activated, the wafer 20 placed on the chuck table 16 is adsorbed to and held by the chuck 40. Furthermore, when the compressed air source or the water supply source is activated, the absorption of the wafer 20 and the chuck 40 is released.

The support ring 30 can be fitted into the annular groove 17 formed at the outer periphery of the chuck 40. The support ring 30 is formed to a substantially cylindrical shape, and the inner diameter thereof is set to be smaller than the outer diameter of the wafer 20. A height dimension in an axial direction of the support ring 30 is set such that an upper end face 31 of the support ring 30 projects out from the front surface of the chuck table 16 by the height of the bump B in a state in which the support ring 30 is fitted into the annular groove 17. The shape of the support ring 30 is not limited to a cylindrical shape, and may be any shape as long as the curved region 26 can be supported to an extent the wafer 20 does not break at the time of back surface grinding of the wafer 20, to be described later.

Figure 4:
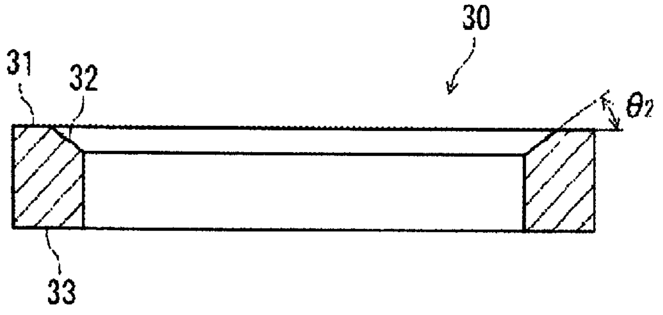
FIG. 4 is a longitudinal cross-sectional view of the support member.

As shown in FIG. 4, the support ring 30 is formed with a support surface 32 in which an inner peripheral edge of the upper end face 31 is cut out to a tapered shape. The shape of the support surface 32 is formed according to the shape of the curved region 26 of the BG film 21. Specifically, the width dimension in the radial direction of the support surface 32 is set according to the width dimension in the radial direction of the curved region 26 of the BG film 21, and the tapered angle Θ2 of the support surface 32 is set according to the tapered angle Θ1 of the actually measured BG film 21. Furthermore, the lower end face 33 of the support ring 30 is formed substantially parallel to the upper end face 31.

The support ring 30 is made of material that can be ground by the grinding stone 14*a* of the end face grinding unit 14, for example, silicon or plastic, and in particular, is preferably made of material exhibiting substantially the same thermal expansion coefficient as the chuck table 16, and for example, alumina ceramics or the like can be considered. Thus, the chuck table 16 and the support ring 30 thermally expand in a substantially uniform manner by the friction heat at the time of grinding, and thus the processing accuracy can be ensured. Note that when a T wrench is used to detach the support ring 30 from the annular groove 17, a tap hole (not shown) is preferably provided in the upper end face 31 of the support ring 30.

Figure 5:
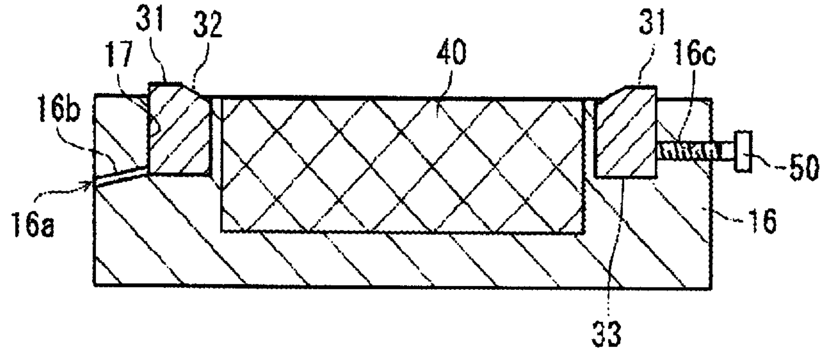
FIG. 5 is a longitudinal cross-sectional view of the chuck table.

As shown in FIG. 5, the support ring 30 fitted into the annular groove 17 is fixed by a bis 50 screwed into a screw hole 16*c* formed toward the radially inner side from the peripheral surface of the chuck table 16. Note that the bis 50 is preferably formed at equal intervals in the circumferential direction of the chuck table 16. The annular groove 17 is communicated to an opening 16*a* formed on the peripheral surface of the chuck table 16 through the drain hole 16*b*. The grinding water is thus drained to the outside without remaining in the annular groove 17 at the time of back surface grinding.

Next, a procedure for back surface grinding the wafer 20 using the processing device 10 will be described based on the drawings.

[Grinding Preparation]

First, the film attachment section 11 attaches the BG film 21 to the wafer 20. The shape (length in the radial direction, tapered angle Θ1 etc.) of the curved region 26 of the BG film 21 attached to the entire surface of the wafer 20 is measured using a surface roughness measuring instrument or the like (not shown).

Next, the inner peripheral edge of the upper end face 31 of the support ring 30 is ground using the grinding device (not shown) so as to correspond to the measured shape of the curved region 26 to form the support surface 32. Note that the grinding device that forms the support surface 32 in the support ring 30 can be considered to be a rotary grinding machine that includes, for example, a stone having a tapered surface corresponding to the shape of the support surface 32, and forms the support surface 32 by pushing the tapered surface of the stone against the inner peripheral edge of the upper end face 31 of the support ring 30 and performing inner diameter processing while rotating each of the support ring 30 and the stone, but this is not the sole case.

Figure 6A:
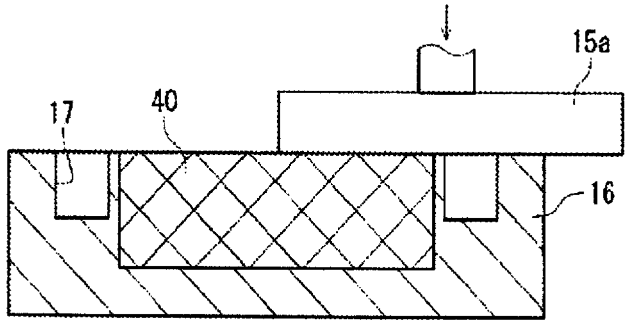
FIG. 6(*a*) is a schematic view showing a state of grinding each front surface of a chuck and the chuck table, FIG. 6(*b*) is a schematic view showing a state of grinding a lower end face of the support member, and FIG. 6(*c*) is a schematic view showing a state of washing with 2 fluids.
Figure 6B:
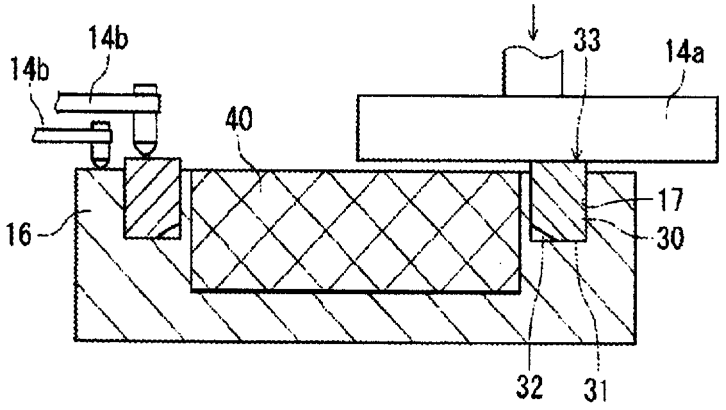
Figure 6C:
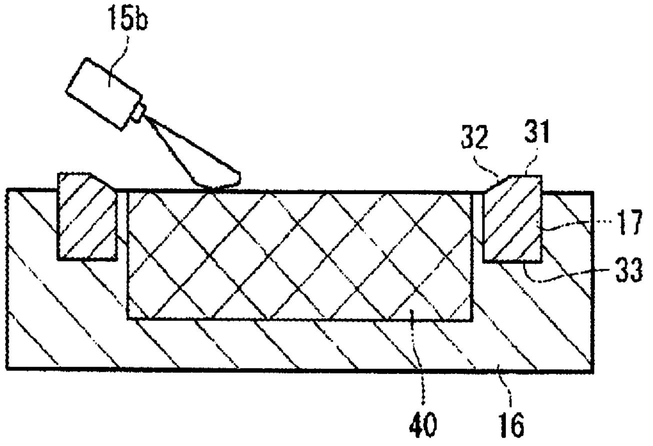

Next, as shown in FIG. 6(*a*), the front surface of the chuck 40 and the front surface of the chuck table 16 are ground to be substantially flat by pressing the grinding stone 15*a* downward for a predetermined time while rotating the grinding stone 15*a* and the chuck table 16.

After the front surface of the chuck 40 and the front surface of the chuck table 16 are ground for a predetermined time, the grinding stone 15*a* and the chuck table 16 are stopped and the grinding stone 15*a* is evacuated. Thereafter, the inside of the annular groove 17 is washed as necessary, and the insertion unit 13 fits the support ring 30 into the annular groove 17 with the lower end face 33 facing upward.

Next, as shown in FIG. 6(*b*), the support ring 30 is ground by pressing the grinding stone 14*a* against the lower end face 33 while rotating the grinding stone 14*a* and the chuck table 16.

The grinding amount of the support ring 30 is set so that the height of the lower end face 33 with respect to the front surface of the chuck table 16 is substantially equal to the distance between the front surface 23 of the wafer 20 and the apex of the bump B, that is, the height of the step difference of the BG film 21 between the bump region 24 and the outer peripheral region 25. Therefore, when processing the wafer 20 in which the heights of the bumps B are different, the grinding amount of the support ring 30 is changed according to the dimension of the bump B.

Furthermore, the support ring 30 can be processed with high accuracy according to the height of the bump B by using the in-process gauge 14*b* and measuring the heights of the lower end face 33 and the front surface of the chuck table 16, and from the difference thereof, measuring the height of the lower end face 33 with respect to the front surface of the chuck table 16 during the processing.

When the lower end face 33 is ground to a predetermined height with respect to the front surface of the chuck table 16, the grinding stone 14*a* and the chuck table 16 are stopped, and the grinding stone 14*a* is evacuated. The insertion unit 13 then detaches the support ring 30 from the annular groove 17, and thereafter inverts the support ring 30 upside down and again fits the support ring 30 into the annular groove 17 with the upper end face 31 facing upward.

As shown in FIG. 6(*c*), before the back surface grinding, the 2 fluids ejected from the 2 fluid nozzle 15*b* is injected toward the front surface of the chuck 40, the front surface of the chuck table 16, and the upper end face 31 of the support ring 30 while rotating the chuck table 16 to wash the sludge and the like produced at the time of grinding of the support ring 30. Thus, when a washing device that pushes the hard washing stone, and the like against the chuck table 16 is used, for example, washing remnant may occur since the upper end face 31 is higher than the front surface of the chuck table 16, whereas the washing using 2 fluids can disperse the 2 fluids over the entire surface of the chuck table 16 to efficiently wash the entire surface regardless of the slight high-low difference between the upper end face 31 and the front surface of the chuck table 16.

[Wafer Grinding]

Figure 7A:
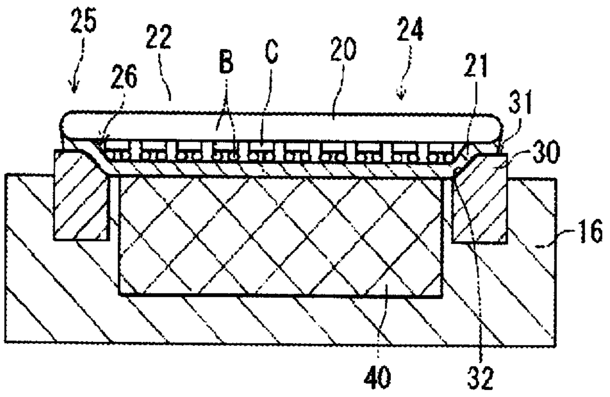
FIG. 7(*a*) is a schematic view showing a state in which the wafer is held by the chuck, FIG. 7(*b*) is an enlarged view of the main part showing a state in which a film is supported by a support surface, and FIG. 7(*c*) is a schematic view showing a state of grinding a back surface of the wafer.
Figure 7B:
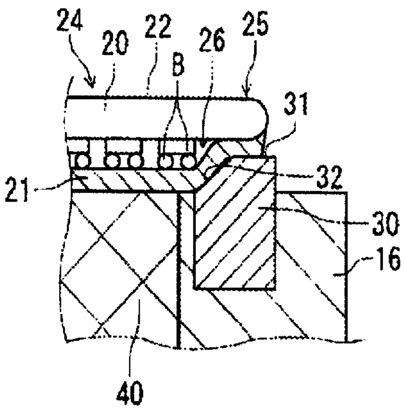
Figure 7C:
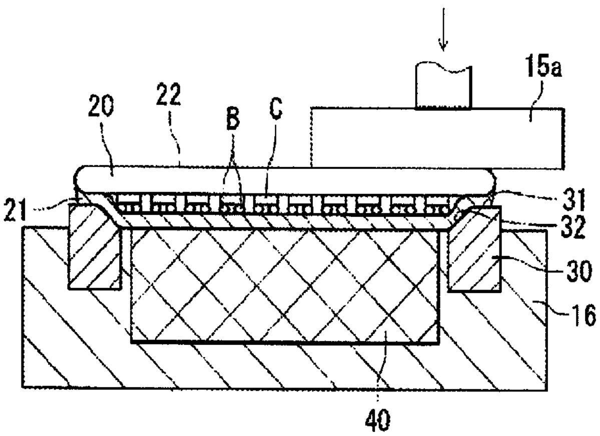
Figure 8:
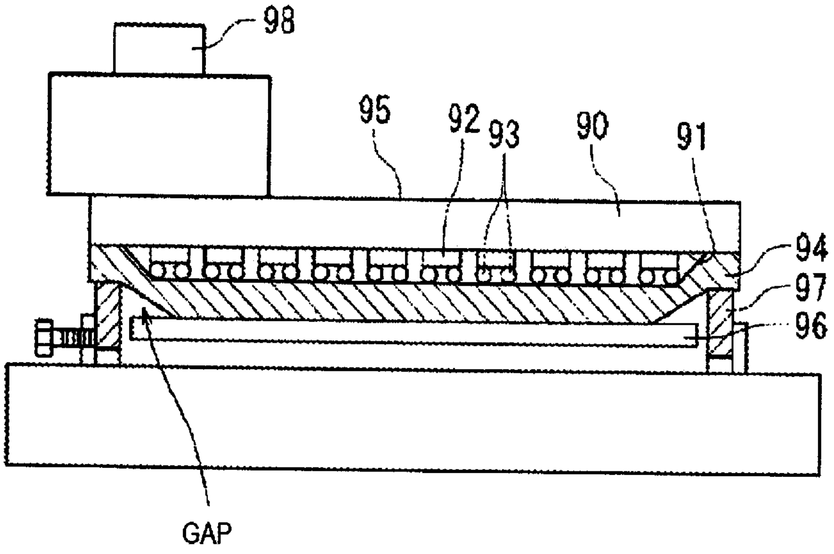
FIG. 8 is a longitudinal cross-sectional view showing a configuration of a conventional processing device.

The robot hand 18 transports the wafer 20, to which the BG film 21 is attached, from the film attachment section 11 to the back surface grinding section 12, and the wafer 20 is placed on the chuck table 16 so that the back surface 22 faces upward, as shown in FIG. 7(*a*).

When a negative pressure is supplied to between the wafer 20 and the chuck 40, the wafer 20 is adsorbed to and held by the chuck 40. At this time, the bump region 24 is supported by the chuck 40, the outer peripheral region 25 is supported by the upper end face 31, and furthermore, the curved region 26 is adhered to and supported by the support surface 32, as shown in FIG. 7(*b*). In other words, the BG film 21 is supported without gap over the entire surface between the support ring 30 and the chuck 40.

Then, as shown in FIG. 7(*c*), the grinding stone 15*a* is pressed downward while rotating the grinding stone 15*a* and the chuck table 16, so that the grinding stone 15*a* grinds the back surface 22 of the wafer 20. At the time of back surface grinding of the wafer 20, the BG film 21 is supported without gap over the entire surface between the support ring 30 and the chuck 40, and hence the wafer 20 can be ground without breaking.

In the embodiment described above, the present invention has been described using the processing device 10 that performs back surface grinding on the wafer 20 by way of an example, but can also be applied to a device or the like that polishes the wafer 20.

In addition, the support ring 30 is not limited to a configuration integrally including the upper end face 31 that supports the outer peripheral region 25 and the support surface 32 that supports the curved region 26, and the upper end face 31 and the support surface 32 may be separately provided.

Furthermore, the present invention can be variously modified other than the above without deviating from the sprint of the present invention and it should be recognized that the present invention includes all such modifications.

REFERENCE SIGNS LIST

10 processing device
11 film attachment section
12 back surface grinding section
13 insertion unit
14 end face grinding unit
14*a* grinding stone
14*b* in-process gauge
15 back surface grinding unit
15*a* grinding stone
15*b* 2 fluid nozzle (washing means)
15*c* in-process gauge
16 chuck table
16*a* opening
16*b* drain hole
16*c* screw hole
17 annular groove
18 robot hand
20 wafer
21 BG film
22 back surface (of wafer)
23 front surface (of wafer)
24 bump region
25 outer peripheral region
26 curved region
30 support ring (support member)
31 upper end face
32 support surface
33 lower end face
40 chuck
50 bis
B bump
C chip

The invention claimed is:

1. A processing device that grinds a back surface of a wafer, that includes a bump region in which bumps are formed on a front surface, and an outer peripheral region around the bump region, and in which a film is attached to the front surface, the processing device comprising:

a chuck capable of holding the bump region of the wafer;

a support member having a support surface that supports a curved region in which a surface of the film curves from the bump region toward the outer peripheral region and is capable of supporting the outer peripheral region of the wafer, further the support surface is formed according to a shape of the curved region;

a chuck table that accommodates the chuck and accommodates the support member at an outer periphery of the chuck, and wherein the support surface, the chuck table, and the chuck are in contact with and support the film without any gap between the bump region and the outer peripheral region of the wafer.

2. The processing device according to claim 1, wherein the support member and the chuck table are made from a material having a thermal expansion coefficient that are substantially the same.

3. The processing device according to claim 1, further comprising a washing means that injects two fluids toward the front surface of the chuck table.

4. The processing device according to claim 1, wherein:

there is no gap between the support surface of said support member and the curved region of the surface of the film that curves from the bump region towards the outer peripheral region of the wafer.

5. The processing device according to claim 1, wherein:

the chuck and the chuck table form a plane surface, and the support member extends out of the plane surface.

6. A processing device that grinds a back surface of a wafer, that includes a bump region in which bumps are formed on a front surface, and an outer peripheral region around the bump region, and in which a film is attached to the front surface, the processing device comprising:

a chuck capable of holding the bump region of the wafer;

a support member having a support surface that supports a curved region in which the film curves from the bump region toward the outer peripheral region, the curved support surface formed according to a shape of the curved region and fully supporting the curved region and is capable of supporting the outer peripheral region of the wafer;

a chuck table that accommodates the chuck and accommodates the support member at an outer periphery of the chuck; and wherein the support member is fitted into an annular groove formed at the outer periphery of the chuck.

7. The processing device according to claim 6, wherein the chuck table is provided with a drain hole that communicates the annular groove and an opening formed in a peripheral surface of the chuck table.

8. The processing device according to claim 6, wherein the support member and the chuck table are made from a material having a thermal expansion coefficient that are substantially the same.

9. The processing device according to claim 6, further comprising a washing means that injects two fluids toward the front surface of the chuck table.

10. A processing method for grinding a back surface of a wafer including a bump region in which bumps are formed on a front surface and an outer peripheral region around the bump region, and in which a film is attached to the front surface, the processing method comprising the steps of:

measuring a shape of a curved region in which the film curves from the bump region toward the outer peripheral region of the film;

forming a support surface corresponding to the shape of the curved region on an inner peripheral edge of an upper end face of the support member;

grinding a front surface of a chuck capable of holding the bump region of the wafer and a front surface of a chuck table accommodating the chuck to be substantially flat;

fitting the support member into an annular groove of the chuck table formed on an outer periphery of the chuck with a lower end face of the support member facing upward;

grinding the lower end face of the support member from the front surface of the chuck table to a predetermined height;

inverting the support member upside down; and holding the wafer by the chuck with the support surface fully supporting the curved region and the upper end face supporting the outer peripheral region.

11. The processing method according to claim 10, wherein in the step of grinding the lower end face of the support member, the lower end face is ground while measuring a height of the lower end face of the support member with respect to a front surface of the chuck table.

* * * * *